(12) United States Patent
Denpoh et al.

(10) Patent No.: US 8,409,459 B2
(45) Date of Patent: Apr. 2, 2013

(54) HOLLOW CATHODE DEVICE AND METHOD FOR USING THE DEVICE TO CONTROL THE UNIFORMITY OF A PLASMA PROCESS

(75) Inventors: Kazuki Denpoh, Kai (JP); Peter L G Ventzek, Austin, TX (US); Lin Xu, Houston, TX (US); Lee Chen, Cedar Creek, TX (US)

(73) Assignee: Tokyo Electron Limited (JP)

( * ) Notice: Subject to any disclaimer, the term of this patent is extended or adjusted under 35 U.S.C. 154(b) by 1309 days.

(21) Appl. No.: 12/039,236

(22) Filed: Feb. 28, 2008

(65) Prior Publication Data

US 2009/0218212 A1    Sep. 3, 2009

(51) Int. Cl.
*H01L 21/306* (2006.01)

(52) U.S. Cl. ............ 216/67; 204/164; 156/345.33; 156/345.34

(58) Field of Classification Search .......... None
See application file for complete search history.

(56) References Cited

U.S. PATENT DOCUMENTS

| | | | |
|---|---|---|---|
| 5,075,594 A * | 12/1991 | Schumacher et al. | 315/111.21 |
| 5,132,597 A * | 7/1992 | Goebel et al. | 315/344 |
| 5,472,565 A * | 12/1995 | Mundt et al. | 216/71 |
| 5,714,031 A * | 2/1998 | Mundt et al. | 156/345.34 |
| 6,379,757 B1 * | 4/2002 | Iacovangelo | 427/576 |
| 6,444,945 B1 * | 9/2002 | Maschwitz et al. | 219/121.54 |
| 6,528,947 B1 * | 3/2003 | Chen et al. | 315/111.21 |
| 6,902,774 B2 * | 6/2005 | Nicolussi | 427/535 |
| 6,903,511 B2 * | 6/2005 | Chistyakov | 315/111.71 |
| 7,009,342 B2 * | 3/2006 | Minakov | 315/111.81 |
| 7,595,594 B2 * | 9/2009 | Korobochko et al. | 315/111.21 |
| 7,632,379 B2 * | 12/2009 | Goto et al. | 156/345.44 |
| 7,663,319 B2 * | 2/2010 | Chistyakov et al. | 315/111.21 |
| 7,692,139 B2 * | 4/2010 | Koo et al. | 250/251 |
| 7,785,672 B2 * | 8/2010 | Choi et al. | 427/569 |
| 7,898,183 B2 * | 3/2011 | Chistyakov et al. | 315/111.21 |
| 8,074,599 B2 * | 12/2011 | Choi et al. | 118/723 R |
| 8,075,690 B2 * | 12/2011 | Keller et al. | 118/715 |
| 8,083,853 B2 * | 12/2011 | Choi et al. | 118/715 |
| 2004/0018320 A1 * | 1/2004 | Nicolussi | 427/535 |
| 2005/0196548 A1 * | 9/2005 | Goedicke et al. | 427/569 |
| 2005/0251990 A1 * | 11/2005 | Choi et al. | 29/558 |
| 2005/0255257 A1 * | 11/2005 | Choi et al. | 427/585 |
| 2006/0228496 A1 * | 10/2006 | Choi et al. | 427/569 |
| 2006/0236934 A1 * | 10/2006 | Choi et al. | 118/723 R |
| 2007/0017636 A1 * | 1/2007 | Goto et al. | 156/345.47 |
| 2007/0221128 A1 * | 9/2007 | Choi et al. | 118/715 |
| 2008/0020146 A1 * | 1/2008 | Choi et al. | 427/446 |
| 2009/0095894 A1 * | 4/2009 | Koo et al. | 250/251 |
| 2009/0197015 A1 * | 8/2009 | Kudela et al. | 427/569 |

FOREIGN PATENT DOCUMENTS

WO    WO 2004107825 A1 * 12/2004

\* cited by examiner

*Primary Examiner* — Allan Olsen

(57) ABSTRACT

A chamber component configured to be coupled to a processing chamber is described. The chamber component comprises one or more adjustable gas passages through which a process gas is introduced to the process chamber. The adjustable gas passage may be configured to form a hollow cathode that creates a hollow cathode plasma in a hollow cathode region having one or more plasma surfaces in contact with the hollow cathode plasma. Therein, at least one of the one or more plasma surfaces is movable in order to vary the size of the hollow cathode region and adjust the properties of the hollow cathode plasma. Furthermore, one or more adjustable hollow cathodes may be utilized to adjust a plasma process for treating a substrate.

4 Claims, 9 Drawing Sheets

HOLLOW CATHODE DEVICE AND METHOD FOR USING THE DEVICE TO CONTROL THE UNIFORMITY OF A PLASMA PROCESS

BACKGROUND OF THE INVENTION

1. Field of the Invention

The invention relates to a method and device for adjusting and/or controlling the uniformity of a plasma process.

2. Description of Related Art

In semiconductor manufacturing, the complexity of devices formed on semiconductor substrates continues to increase at a rapid pace, while the size of features, such as transistor gates, continues to decrease well below the 93 nanometer (nm) technology node. As a result, manufacturing processes require increasingly sophisticated unit process and process integration schemes, as well as process and hardware control strategies to ensure the uniform fabrication of devices across the substrate. For example, during the fabrication of a gate electrode structure in a transistor device, patterning systems and etching systems, which facilitate the formation of the gate structure in a plurality of material films formed on the substrate, are required to achieve and preserve the gate structure critical dimension (CD) vertically within the device being fabricated as well as laterally across the substrate from device-to-device. A reduction of variations in the CD, as well as variations in profile and side-wall angle (SWA), across the substrate can affect the uniform yield of high performance devices (i.e., speed, power consumption, etc.).

The fabrication of integrated circuits (IC) in the semiconductor industry typically employs plasma to create and assist surface chemistry within a processing chamber necessary to remove material from and deposit material on a substrate. In general, plasma is formed within the processing chamber under vacuum conditions by heating electrons in the presence of an electric field to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

In semiconductor manufacturing, numerous techniques exist for creating plasma including, but not limited to, capacitively coupled plasma (CCP) systems, inductively coupled plasma (ICP) systems, electron cyclotron resonance (ECR) plasma systems, helicon wave plasma systems, surface wave plasma systems, slotted plane antenna (SPA) plasma systems, etc. Plasma is formed from the interaction of the supplied process gas with electro-magnetic (EM) field propagation at frequencies in the radio frequency (RF) or microwave spectrum.

However, common to many plasma processing systems, process performance suffers from process non-uniformities, including a spatially non-uniform plasma density. During an etching process, process non-uniformities may lead to spatial non-uniformities in the distribution of a feature critical dimension (CD) across the substrate or a side-wall angle (SWA) across the substrate. For example, during gate structure formation, it is desirable to achieve a uniform distribution of the gate width (at the top and bottom of the etched feature, as well as the region there between) across the substrate following an etching process or series of etching processes. Failure to achieve uniform or substantially uniform process results leads to a reduction in the yield of high performance devices as indicated above.

Therefore, since improving process uniformity in semiconductor manufacturing has always been an important goal, there remains a need for systems that improve process parameter uniformity across the surfaces of substrates during processing.

SUMMARY OF THE INVENTION

The invention relates to a chamber component configured to be coupled to a processing chamber and a method of operating the chamber component.

Further, the invention relates to a chamber component configured to be coupled to a processing chamber. The chamber component comprises one or more adjustable gas passages through which a process gas is introduced to the process chamber. The adjustable gas passage may be configured to form a hollow cathode that creates a hollow cathode plasma in a hollow cathode region having one or more plasma surfaces in contact with the hollow cathode plasma. Therein, at least one of the one or more plasma surfaces is movable in order to vary the size of the hollow cathode region and adjust the properties of the hollow cathode plasma. Furthermore, one or more adjustable hollow cathodes may be utilized to adjust a plasma process for treating a substrate.

According to one embodiment, a chamber component configured to be coupled to a processing chamber is described, comprising: a chamber element comprising a first surface on a supply side of the chamber element and a second surface on a process side of the chamber element, the process side opposing the supply side, wherein the chamber element comprises a reentrant cavity formed in the first surface and a conduit having an inlet coupled to the reentrant cavity and an outlet coupled to the second surface; an insertable member configured to couple with the reentrant cavity, the insertable member having one or more passages formed there through and each of the one or more passages are aligned off-axis from the conduit; and means for adjusting the position of the insertable member within the reentrant cavity, wherein the one or more passages are configured to receive a process gas on the supply side and the conduit is configured to distribute the process gas from the one or more passages on the process side.

According to another embodiment, a hollow cathode device is described, comprising: a hollow cathode configured to create a hollow cathode plasma in a hollow cathode region having one or more plasma surfaces in contact with the hollow cathode plasma, wherein at least one of the one or more plasma surfaces is movable in order to vary the size of the hollow cathode region and adjust the properties of the hollow cathode plasma.

According to another embodiment, a gas distribution system is described, comprising: a shower head gas distribution plate having a supply side that interfaces with a gas supply plenum, a process side that interfaces with a process space in a processing chamber, and a plurality of gas passages formed from the supply side to the process side, wherein each of the plurality of gas passages comprises a counter-bore formed in the supply side that is configured to allow the generation of a hollow cathode plasma and a conduit having an inlet coupled to the counter-bore and an outlet coupled to the process side; one or more insertable members uniquely configured to slidably insert within the counter-bore of the plurality of gas passages and configured to adjust the space available in the counter-bore to generate the hollow cathode plasma, wherein each of the one or more insertable members comprises one or more through-holes that are not aligned with the conduit; and a voltage source coupled to the shower head gas distribution plate and configured to couple a voltage to the chamber element in order to form the hollow cathode plasma in any one of the plurality of gas passages, wherein the space available in the counter-bore of at least one of the plurality of gas passages is different than the space available in the counter-bore of at least one of the remaining gas passages of the plurality of gas passages.

According to yet another embodiment, a method of adjusting the spatial distribution of plasma in a process chamber is described, comprising: forming plasma in a process chamber using a plasma generation system; injecting electrons from one or more hollow cathode plasma sources coupled to the process chamber; and adjusting the intensity of the hollow cathode plasma formed in at least one of the one or more hollow cathode plasma sources.

BRIEF DESCRIPTION OF THE DRAWINGS

In the accompanying drawings.

DETAILED DESCRIPTION OF EXEMPLARY EMBODIMENTS

In the following description, purposes of explanation and not limitation, specific details are set forth, such as a particular geometry of the treatment system or the plasma processing system and descriptions of various components. However, it should be understood that the invention may be practiced in other embodiments that depart from these specific details.

Nonetheless, it should be appreciated that, contained within the description are features which, notwithstanding the inventive nature of the general concepts being explained, are also of an inventive nature.

In material processing methodologies, plasma is often utilized to create and assist surface chemistry on a substrate to facilitate the removal of material from the substrate or to facilitate film forming reactions for depositing material on the substrate. During the etching of a substrate, plasma may be utilized to create reactive chemical species that are suitable for reacting with the certain materials on the surface of a substrate. Furthermore, during the etching of a substrate, plasma may be utilized to create charged species that are useful for delivering energy to surface reactions on the substrate.

As described above, common to many plasma processing systems, process performance suffers from process non-uniformities, including a spatially non-uniform plasma density. For example, during an etching process, process non-uniformities may lead to spatial non-uniformities in the distribution of a feature critical dimension (CD) across the substrate or a side-wall angle (SWA) across the substrate.

Figure 2A:
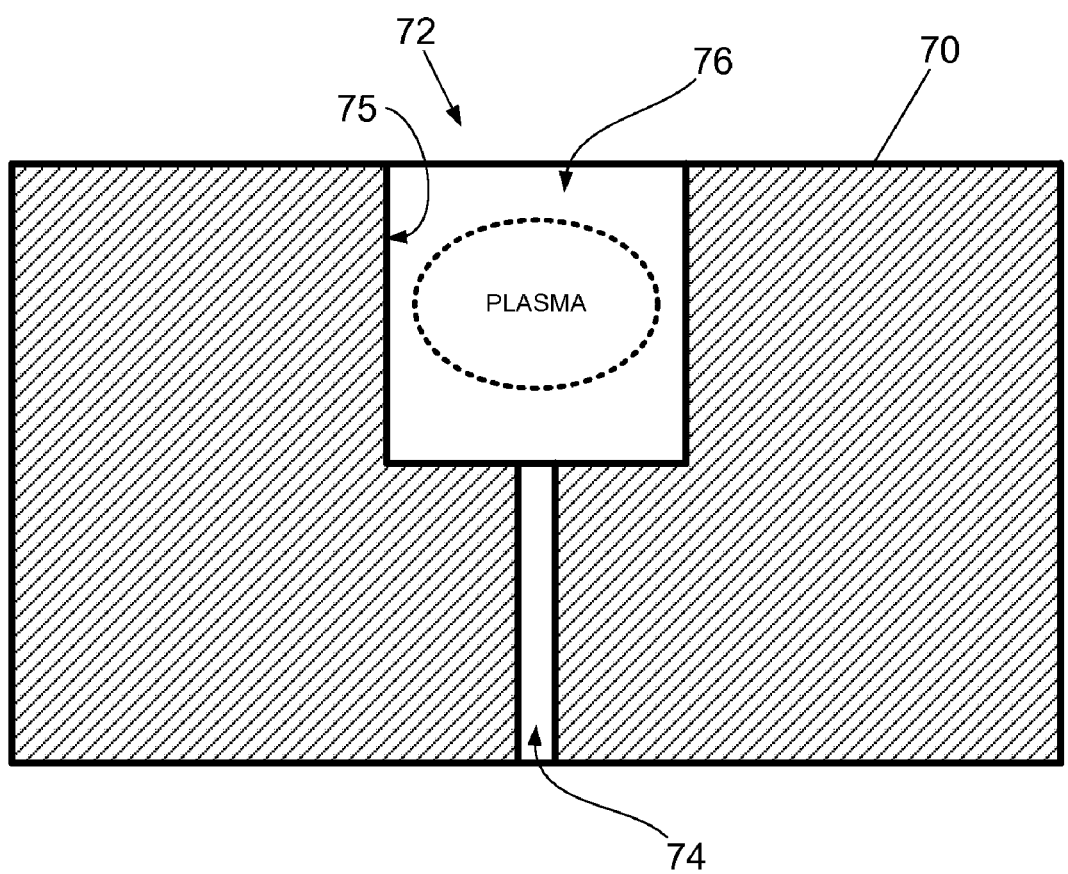
FIG. 2A shows an exploded view of a fluid passage.

In plasma processing systems, the process gas is introduced to the processing chamber through a shower head gas distribution system having a plurality of gas passages formed there through. For example, FIG. 2A illustrates an exploded cross-sectional view of a gas passage 72 formed through a shower head gas distribution plate 70. Due to the difficulty in milling a high aspect ratio orifice through a (relatively) thick piece of material, the gas passage 72 is formed by creating a counter-bore 76 having a sidewall 75 on a supply side of the shower head gas distribution plate 70, and then milling a (relatively) narrow diameter gas conduit 74 through the remaining portion of the shower head gas distribution plate 70 to a process side.

However, in the presence of electric fields, utilized for example during plasma formation, hollow cathode discharges may be triggered within these gas passages. In particular, the hollow cathode (HC) discharge occurs in the counter-bore 76. In plasma processing, such hollow cathode discharges may introduce HC electrons to the process plasma and may influence or enhance various plasma properties, such as plasma density or electron temperature or both.

Figure 2B:
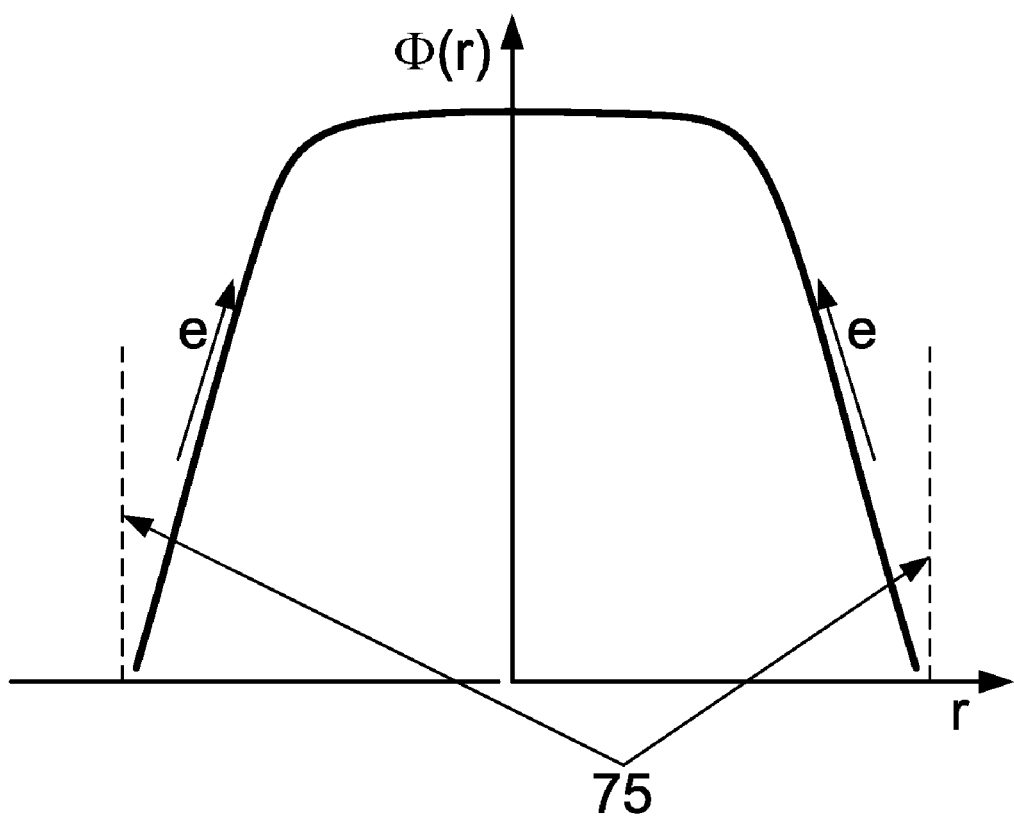
FIG. 2B illustrates a mechanism for creating a hollow cathode discharge in a fluid passage.

As illustrated in FIG. 2B, a plasma discharge can occur in counter-bore 76 between side-walls 75. Therein, a symmetrical field potential $\Phi(r)$ is established and electrons (e) are trapped, hence, creating the possibility of a hollow cathode discharge. In a balanced field, a surface emitted electron (e) may be accelerated through the adjacent sheath (proximate the counter-bore side wall where the electron is emitted) under a first field strength, and then decelerated through the opposing sheath (at the opposing wall of the counter-bore) at a second field strength that is substantially the same as the first field strength. As a result, the possibility for the electron to become trapped between the opposing sheaths and not strike an opposing wall is increased.

Therefore, according to one embodiment, a hollow cathode device is described, comprising: a hollow cathode configured to create a hollow cathode plasma in a hollow cathode region having one or more plasma surfaces in contact with the hollow cathode plasma, wherein at least one of the one or more plasma surfaces is movable in order to vary the size of the hollow cathode region and adjust the properties of the hollow cathode plasma.

Additionally, according to another embodiment, a chamber component comprises one or more adjustable gas passages through which a process gas is introduced to the process chamber. The adjustable gas passage may be configured to form a hollow cathode that creates a hollow cathode plasma in a hollow cathode region having one or more plasma surfaces in contact with the hollow cathode plasma. Therein, at least one of the one or more plasma surfaces is movable in order to vary the size of the hollow cathode region and adjust the properties of the hollow cathode plasma. Furthermore, one or more adjustable hollow cathodes may be utilized to adjust a plasma process for treating a substrate.

Further, according to yet another embodiment, a chamber component configured to be coupled to a processing chamber is described. The chamber component comprises a chamber element comprising a first surface on a supply side of the chamber element and a second surface on a process side of the chamber element, the process side opposing the supply side, wherein the chamber element comprises a reentrant cavity formed in the first surface and a conduit having an inlet coupled to the reentrant cavity and an outlet coupled to the second surface. Additionally, the chamber component comprises an insertable member configured to couple with the reentrant cavity, wherein the insertable member has one or more passages formed there through and each of the one or more passages are aligned off-axis from the conduit. Further, the chamber component comprises means for adjusting the position of the insertable member within the reentrant cavity, wherein the one or more passages are configured to receive a process gas on the supply side and the conduit is configured to distribute the process gas from the one or more passages on the process side.

Figure 1:
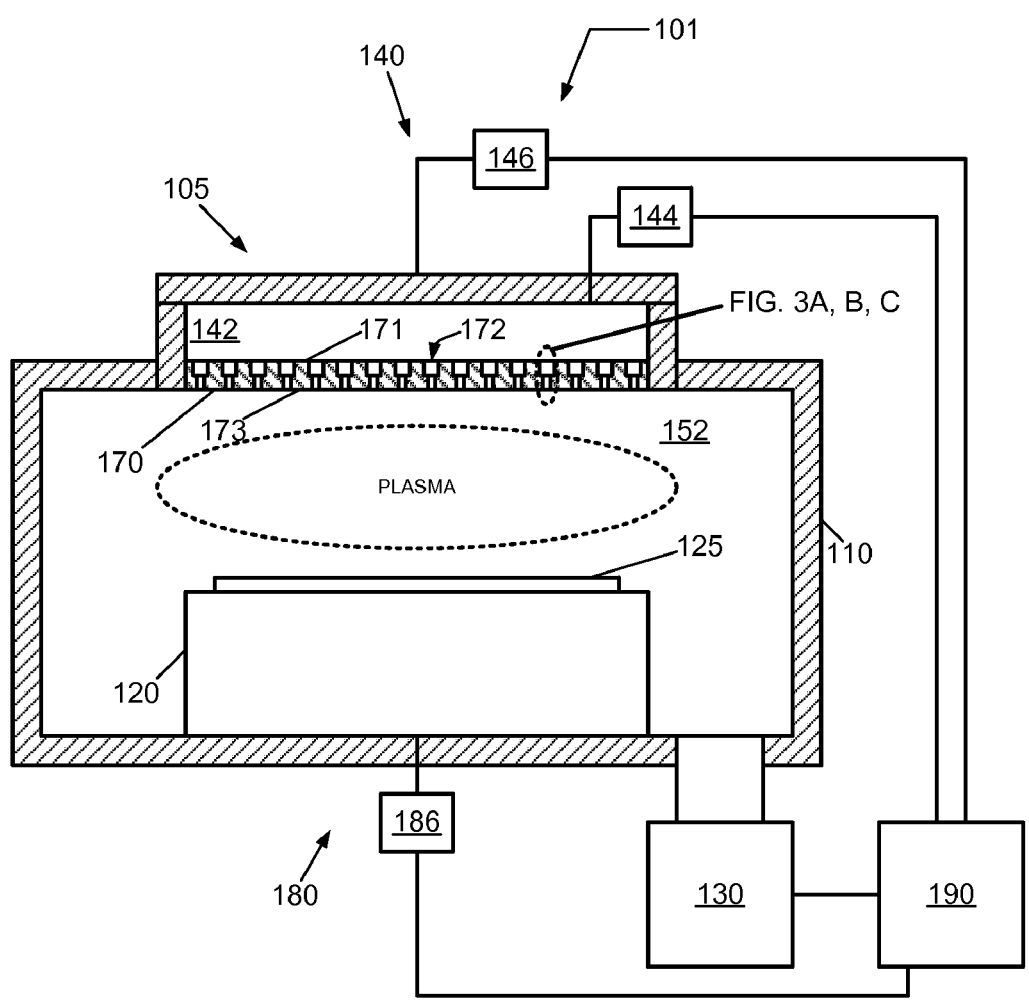
FIG. 1 shows a treatment system according to an embodiment.

According to yet another embodiment, a plasma processing system 101 is depicted in FIG. 1 comprising a plasma processing chamber 110, a substrate holder 120, upon which a substrate 125 to be processed is affixed, and a vacuum pumping system 130. Substrate 125 may be a semiconductor substrate, a wafer, a flat panel display, or a liquid crystal display.

A gas distribution system 105 is coupled to the plasma processing chamber 110 and is configured to introduce an ionizable gas or mixture of process gases, wherein the gas distribution system 105 is configured to distribute a process gas above substrate 125. For a given flow of process gas, the process pressure is adjusted using the vacuum pumping system 130.

A plasma generation system 140 is coupled to the plasma processing chamber 110 and is configured to facilitate the generation of plasma in process space 152 in the vicinity of a surface of substrate 125. Plasma can be utilized to create materials specific to a pre-determined materials process, and/or to aid the removal of material from the exposed surfaces of substrate 125. The plasma processing system 101 can be configured to process substrates of any desired size, such as 200 mm substrates, 300 mm substrates, or larger. The plasma generation system 140 comprises at least one of a capacitively coupled plasma source, an inductively coupled plasma source, a transformer coupled plasma source, a microwave plasma source, a surface wave plasma source, or a helicon wave plasma source.

For example, the plasma generation system 140 may comprise an upper electrode to which radio frequency (RF) power is coupled via a RF generator 146 through an optional impedance match network. EM energy at an RF frequency is capacitively coupled from the upper electrode to plasma in process space 152. A typical frequency for the application of RF power to the upper electrode can range from about 10 MHz to about 100 MHz. Further, for example, the upper electrode may be integrated with the gas distribution system 105.

An impedance match network may serve to improve the transfer of RF power to plasma by reducing the reflected power. Match network topologies (e.g. L-type, π-type, T-type, etc.) and automatic control methods are well known to those skilled in the art.

A substrate bias system 180 may be coupled to the plasma processing chamber 110 and may be configured to electrically bias substrate 125. For example, substrate holder 120 can comprise an electrode through which RF power is coupled to substrate 125 in order to adjust and/or control the level of energy for ions incident upon the upper surface of substrate 125. For example, substrate holder 120 can be electrically biased at a RF voltage via the transmission of RF power from a second RF generator 186 through an optional impedance match network to substrate holder 120. The substrate bias system 180 may serve to heat electrons to form and maintain plasma. Additionally, the substrate bias system 180 may serve to adjust and/or control the ion energy at the substrate. A typical frequency for the RF bias can range from about 0.1 MHz to about 100 MHz. RF systems for plasma processing are well known to those skilled in the art.

Vacuum pumping system 130 may include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 110. The pressure measuring device can be, for example, a Type 628B Baratron absolute capacitance manometer commercially available from MKS Instruments, Inc. (Andover, Mass.).

Controller 190 may comprise a microprocessor, memory, and a digital I/O port capable of generating control voltages sufficient to communicate and activate inputs to plasma processing system 101 as well as monitor outputs from plasma processing system 101. Moreover, controller 190 can be coupled to and can exchange information with gas distribution system 105, plasma generation system 140, substrate holder 120, substrate bias system 180, and vacuum pumping system 130. For example, a program stored in the memory can be utilized to activate the inputs to the aforementioned components of plasma processing system 101 according to a process recipe in order to perform a plasma assisted process on substrate 125.

Controller 190 may be locally located relative to the plasma processing system 101, or it may be remotely located relative to the plasma processing system 101. For example, controller 190 can exchange data with plasma processing system 101 using a direct connection, an intranet, and/or the internet. Controller 190 can be coupled to an intranet at, for example, a customer site (i.e., a device maker, etc.), or it can be coupled to an intranet at, for example, a vendor site (i.e., an equipment manufacturer). Alternatively or additionally, controller 190 can be coupled to the internet. Furthermore, another computer (i.e., controller, server, etc.) can access controller 190 to exchange data via a direct connection, an intranet, and/or the internet.

Furthermore, embodiments of this invention may be used as or to support a software program executed upon some form of processing core (such as a processor of a computer, e.g., controller 190) or otherwise implemented or realized upon or within a machine-readable medium. A machine-readable medium includes any mechanism for storing information in a form readable by a machine (e.g., a computer). For example, a machine-readable medium can include such as a read only memory (ROM); a random access memory (RAM); a magnetic disk storage media; an optical storage media; and a flash memory device, etc.

The gas distribution system 105 is configured to receive a flow of process gas from a gas supply system 144 through an inlet to a gas supply plenum 142 and distribute the flow of process gas in a process space 152. The gas distribution system 105 may comprise a shower head gas distribution plate 170 having a supply side that interfaces with the gas supply plenum 142, a process side that interfaces with the process space 152, and a plurality of gas passages 172 formed from the supply side 171 to the process side 173.

Figure 3A:
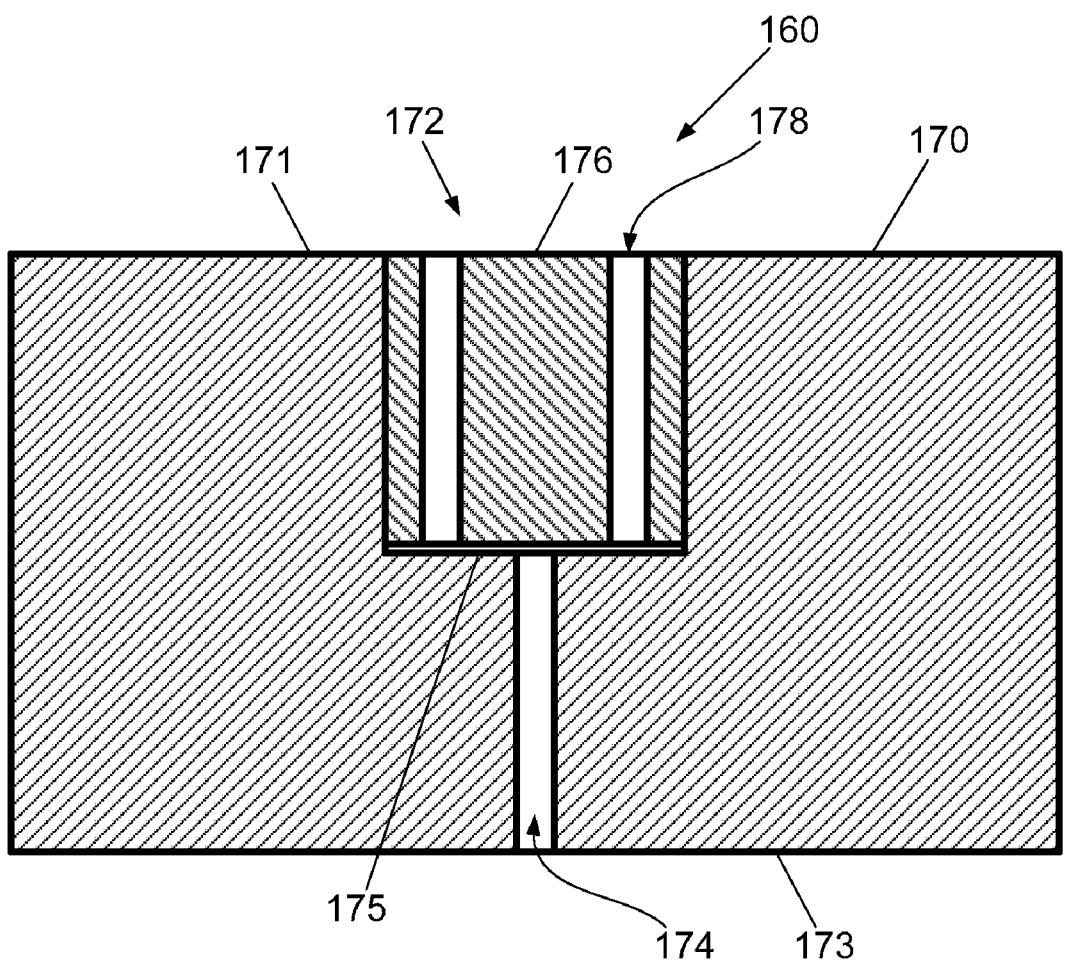
FIG. 3A shows an exploded, cross-sectional view of a fluid passage according to an embodiment.

Referring now to FIG. 3A, an exploded cross-sectional view of a chamber element having an adjustable gas passage 160 is provided. The chamber element may comprise a shower head gas distribution plate 170 through which a process gas is introduced to a processing system for treating a substrate. The adjustable gas passage 160 comprises a gas passage 172 having a reentrant cavity 175 formed in the supply side 171 and a conduit 174 having an inlet coupled to the reentrant cavity 175 and an outlet coupled to the process side 173. For example, the reentrant cavity 175 may comprise a counter-bore. The adjustable gas passage 160 further comprises an insertable member 176 configured to slidably insert within the reentrant cavity 175 and configured with one or more passages 178 formed there through. Each of the one or more passages 178 are aligned off-axis from the conduit 174, i.e., as shown in FIG. 3A, each of the one or more passages 178 is mis-aligned with conduit 174. However, one of the one or more passages 178 may be aligned on-axis with the conduit 174.

Figure 4:
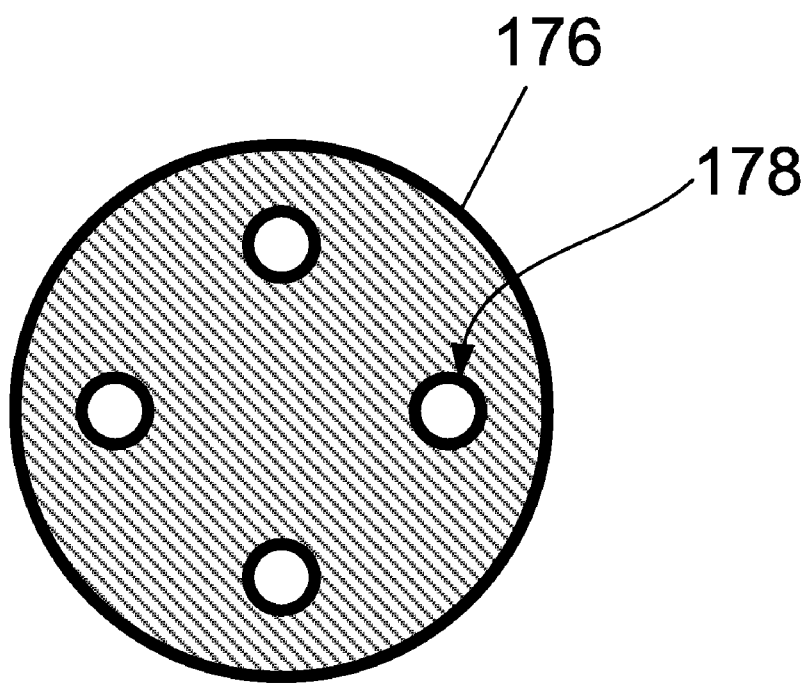
FIG. 4 shows an exploded, top view of a fluid passage according to an embodiment.

Referring now to FIG. 4, a top view of insertable member 176 is illustrated. Insertable member 176 comprises four passages 178 positioned every 90 degrees. Although only four passages 178 are shown, other arrangements are possible. The one or more passages 178 may include 1, 2, 3, 5, or more, and the distribution of the one or more passages 178 may be arbitrary. Some of the passages 178 may be mis-aligned with conduit 174, and one may be aligned with conduit 174. Therefore, process fluid flows from the supply side 171 through the one or more passages 178, through the micro-space between the bottom of the insertable member 176 and the base of the reentrant cavity 175, and through the conduit 174 to the process side 173.

The micro-space at the bottom of the reentrant cavity 175 may be the space remaining once the insertable member 176 is introduced to its full extent into the reentrant cavity 175. Alternatively, the maximum width of the micro-space may selected to be less than a Debye length (e.g., the mean free path or mean distance an ion will travel in a quiescent plasma, under the conditions which sustain the plasma, before neutralization by recombination with an electron occurs) for a hollow cathode discharge formed in the reentrant cavity 175 when the insertable member 176 is not present. Alternatively, the bottom surface of the insertable member 176 or the bottom surface of the reentrant cavity 175 or both may be scored (i.e., formation of a groove) to allow a less-restricted flow of the process gas from the one or more passages 178 to the conduit 174.

As illustrated in FIG. 3A, the insertion of the insertable member 176 into the reentrant cavity 175 disturbs the symmetric field (illustrated in FIG. 2B). As a result, an unbalanced field pattern is formed across the one or more passages 178. In an unbalanced field, a surface emitted electron may be accelerated through the adjacent sheath at a first field strength, while the electron is decelerated through the opposing sheath at a second field strength that is different than the first field strength. Therefore, the possibility the electron strikes the opposing wall is increased (hence, the electron does not get trapped). As a result, the probability of forming a hollow cathode plasma is diminished, and any hollow cathode plasma that may have existed may be extinguished.

Figure 3B:
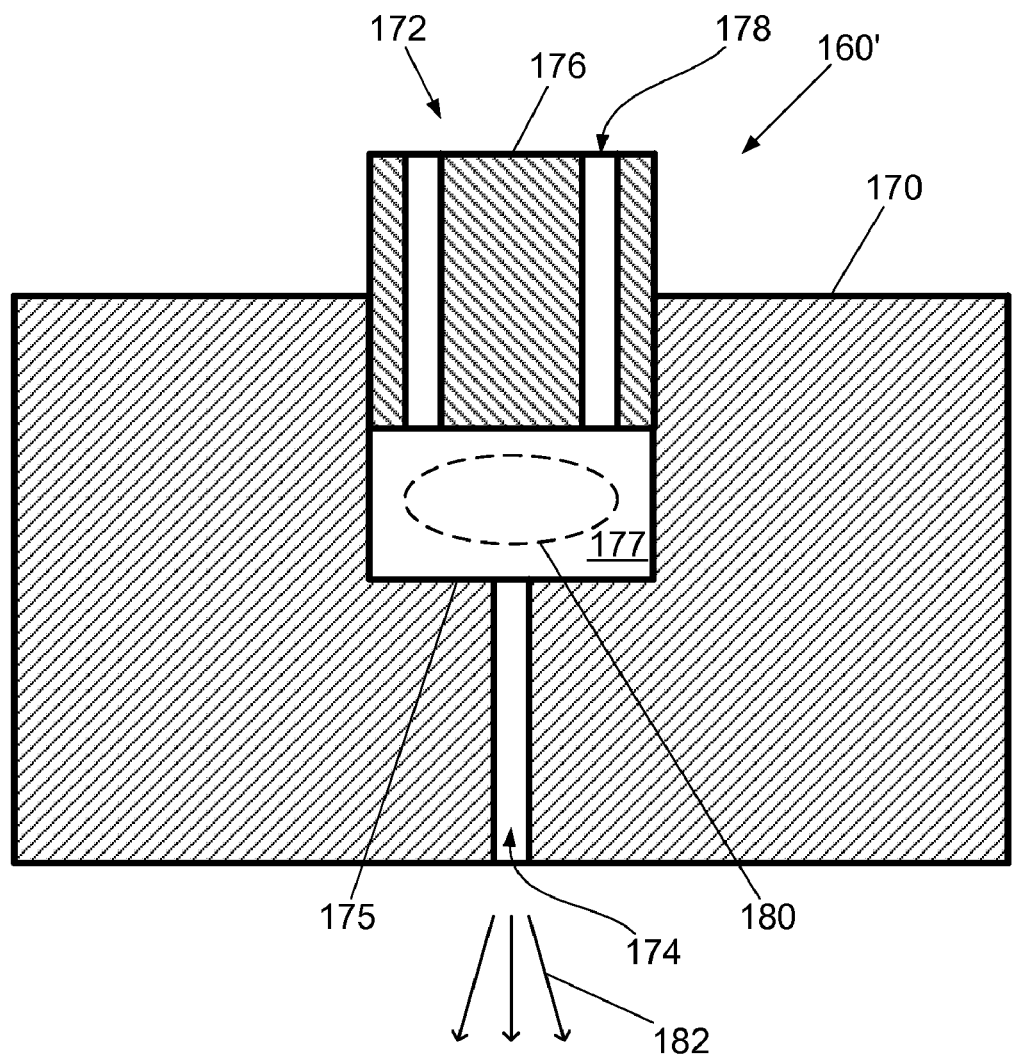
FIG. 3B shows an exploded, cross-sectional view of a fluid passage according to another embodiment.

Referring now to FIG. 3B, an exploded cross-sectional view of a chamber element having an adjustable gas passage 160' is provided. The chamber element may comprise a shower head gas distribution plate 170 through which a process gas is introduced to a processing system for treating a substrate. The adjustable gas passage 160' may comprise similar parts as the embodiment provided in FIG. 3A. However, as illustrated in FIG. 3B, the insertable member 176 is partially inserted into the reentrant cavity 175, such that a hollow cathode region 177 is provided within which a hollow cathode plasma 180 is formed. As a result of hollow cathode plasma 180, hollow cathode electrons 182 issue from conduit 174 along with process gas.

Figure 3C:
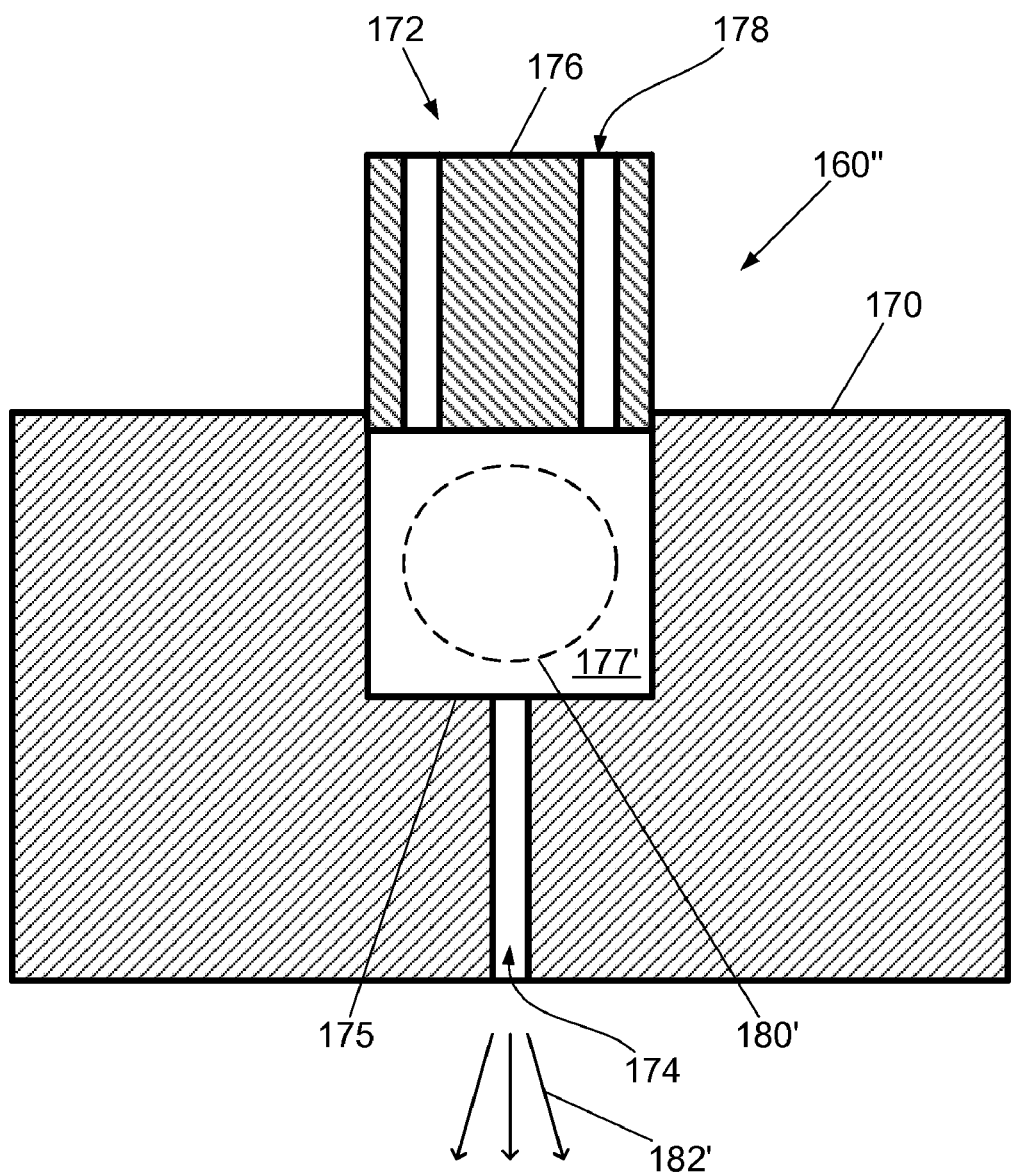
FIG. 3C shows an exploded, cross-sectional view of a fluid passage according to another embodiment.

Referring now to FIG. 3C, an exploded cross-sectional view of a chamber element having an adjustable gas passage 160" is provided. The chamber element may comprise a shower head gas distribution plate 170 through which a process gas is introduced to a processing system for treating a substrate. The adjustable gas passage 160" may comprise similar parts as the embodiment provided in FIGS. 3A and 3B. However, as illustrated in FIG. 3C, the insertable member 176 is partially inserted into the reentrant cavity 175, such that a hollow cathode region 177' is provided within which a hollow cathode plasma 180' is formed. Relative to FIG. 3B, hollow cathode region 177' is larger than hollow cathode region 177, hence, permitting the formation of a more intense hollow cathode plasma 180' in FIG. 3C. As a result of the intense hollow cathode plasma 180', an increased flux of hollow cathode electrons 182' issue from conduit 174 along with process gas.

As illustrated in FIGS. 3B and 3C, the hollow cathode regions 177, 177' are enclosed by several plasma surfaces, i.e., the internal surfaces of the reentrant cavity 175 and the bottom surface of the insertable member 176. In order to change the properties of the hollow cathode plasma in hollow cathode regions 177, 177', the position of one of the plasma surfaces is adjusted or moved, i.e., the bottom surface of the insertable member 176.

When one of the one or more passages 178 is aligned on-axis with conduit 174, it may be desirable that the cross-sectional dimension of the passage 178 that is aligned with conduit 174 is relatively small such that control of the properties of the hollow cathode plasma can be achieved, i.e., the hollow cathode may be turned on or off, and the intensity of the hollow cathode plasma may be adjusted. For example, the maximum cross-sectional dimension may selected to be less than a Debye length for a hollow cathode discharge formed in the reentrant cavity 175 when the insertable member 176 is not present.

The insertable member 176 may be composed of a conductive, a non-conductive, or a semi-conductive material. The insertable member 176 may be composed of a dielectric material. For example, the insertable member 176 may be composed of a ceramic material. Additionally, for example, the insertable member 176 may be composed of silicon, silicon oxide, silicon nitride, silicon carbide, aluminum oxide, aluminum nitride, polytetrafluoroethylene (PTFE), or polyimide, or a combination of two or more thereof.

Shower head gas distribution plate 170 may be composed of a conductive, a non-conductive, or a semi-conductive material. The shower head gas distribution plate 170 may be composed of silicon or doped silicon. Alternatively, the shower head gas distribution plate 170 may be composed of a dielectric coated metal, such as anodized aluminum or ceramic coated aluminum. Internal surfaces of the reentrant cavity 175 and the conduit 174 may also be coated with a protective barrier, such as a surface anodization or ceramic spray coating.

The reentrant cavity 175 may comprise a counter-bore, such as a cylindrical counter-bore. For example, the diameter of the cylindrical counter-bore may range from about 1 mm (millimeter) to about 20 mm or, desirably, the diameter of the cylindrical counter-bore may range from about 2 mm to 10 mm (e.g., about 4-5 mm). The conduit 174 may comprise a cylindrical passage having a diameter less than the diameter of the cylindrical counter-bore. The conduit 174 may be centered on the reentrant cavity 175 (e.g., same centerline axis).

For example, the diameter of the conduit may range from 10 microns (1 micron=$10^{-6}$m) to about 1 mm or, desirably, the diameter of the conduit may range from about 50 microns to about 500 microns (e.g., about 100 microns). Furthermore, each of the one or more passages 178 may comprise a cylindrical passage. For example, the diameter of each of the one or more passages may range from 10 microns to about 1 mm or, desirably, the diameter of each of the one or more passages may range from about 50 microns to about 500 microns (e.g., about 100 microns).

The insertable member 176 may comprise a cylindrical member having an outer surface configured to mate with the inner surface of the cylindrical counter-bore, a top surface and a bottom surface. Additionally, the one or more passages 178 extend from the top surface to the bottom surface at the base of the counter-bore.

Figure 5:
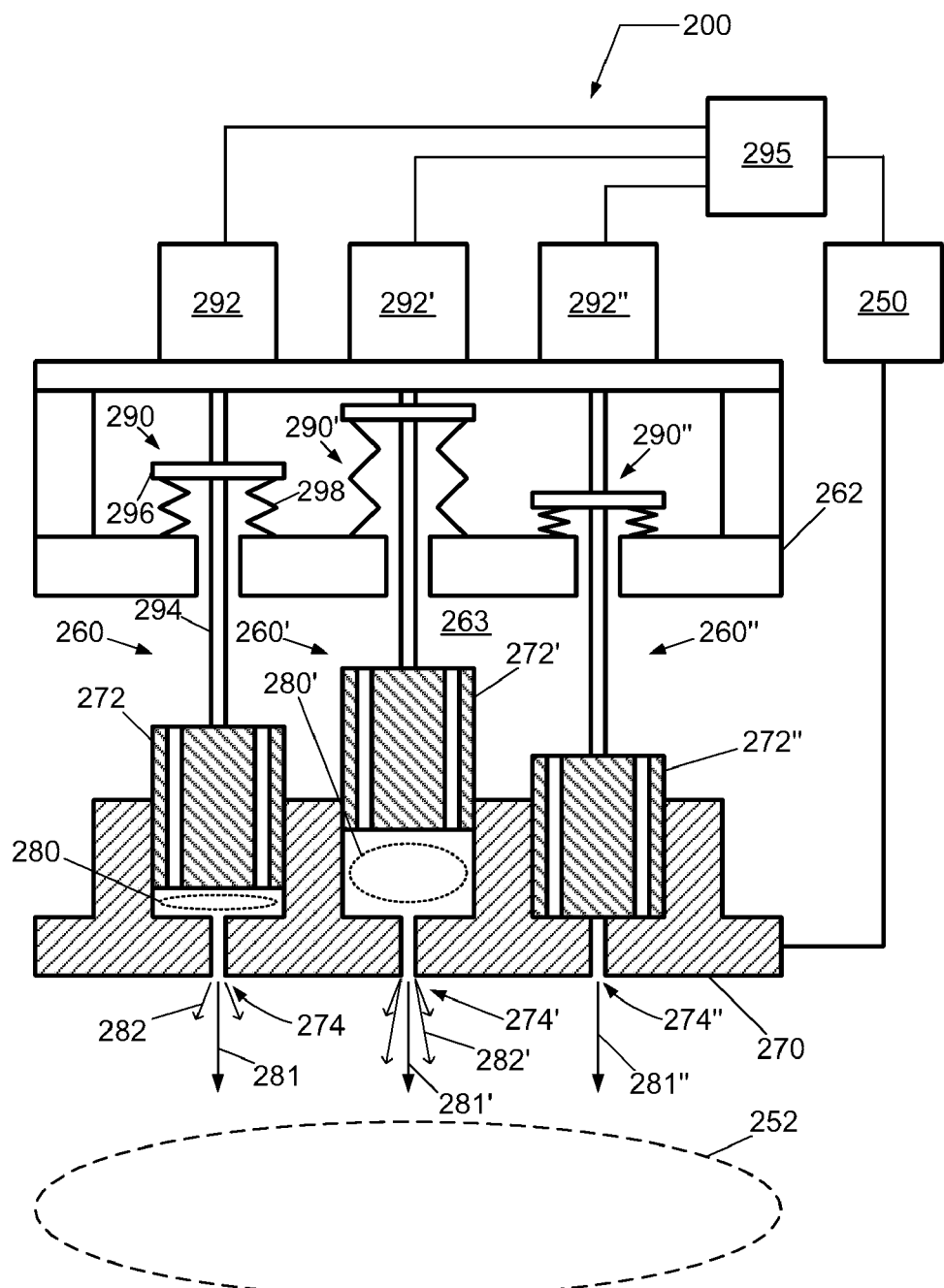
FIG. 5 illustrates a system for adjusting the spatial distribution of plasma according to another embodiment.

Referring now to FIG. 5, a partial cross-sectional view of a chamber element having a plurality of adjustable gas passages 260, 260' and 260" is provided. The chamber element may comprise a gas distribution system 200 having a gas distribution plate 270 through which a process gas is introduced to a plasma processing system for treating a substrate. Each adjustable gas passage 260, 260', 260" comprises a gas passage having a reentrant cavity formed in the supply side of gas distribution plate and a conduit having an inlet coupled to the reentrant cavity and an outlet coupled to the process side of the gas distribution plate. Each adjustable gas passage 260, 260', 260" further comprises an insertable member 272, 272', 272" configured to slidably insert within the reentrant cavity and configured with one or more passages formed there through. Each of the one or more passages may be aligned off-axis from the conduit, i.e., as shown in FIG. 5, each of the one or more passages is mis-aligned with conduit. However, one of the one or more passages may be aligned on-axis with the conduit.

As shown in FIG. 5, the gas distribution system 200 may further comprise a voltage source 250 that is coupled to the gas distribution plate 270 or an upper assembly/electrode which houses or supports the gas distribution plate 270. Voltage source 250 may be utilized to form process plasma 252 or assist the formation of process plasma 252. Voltage source 250 may comprise an alternating current (AC) voltage source or a direct current (DC) voltage source or a combination thereof. For example, voltage source 250 may comprise a radio frequency (RF) generator configured to couple a RF power to the gas distribution plate 270 or the upper assembly/electrode. Additionally, for example, voltage source 250 may comprise RF generator 146 for plasma generation system 140 shown in FIG. 1. Alternatively, voltage source 250 may comprise a DC voltage source configured to couple a negative DC voltage to the gas distribution plate 270 or the upper assembly/electrode.

As illustrated in FIG. 5, the insertable member 272 for adjustable gas passage 260 is partially inserted into the reentrant cavity, such that a hollow cathode region is provided within which a first hollow cathode plasma 280 is formed. As a result of hollow cathode plasma 280, hollow cathode electrons 282 issue from conduit 274 along with process gas 281.

Additionally, as illustrated in FIG. 5, the insertable member 272' for adjustable gas passage 260' is partially inserted into the reentrant cavity, such that a hollow cathode region is provided within which a second hollow cathode plasma 280' is formed. Relative to adjustable gas passage 260, the hollow cathode region for adjustable gas passage 260' is larger than the hollow cathode region for adjustable gas passage 260, hence, permitting the formation of a more intense hollow cathode plasma 280'. As a result of the intense hollow cathode plasma 280', an increased flux of hollow cathode electrons 282' issue from conduit 274' along with process gas 281'.

Furthermore, as illustrated in FIG. 5, the insertable member 272" for adjustable gas passage 260" is fully inserted into the reentrant cavity, such that a hollow cathode region is not provided and a hollow cathode plasma is not formed or is extinguished. As a result, only process gas 281" issues from conduit 274".

Referring still to FIG. 5, each adjustable gas passage 260, 260', 260" comprises a device 290, 290', 290", respectively, for adjusting the position of the insertable member within the reentrant cavity formed in the gas distribution plate 270. Gas distribution system 200 further comprises a housing member 262 configured to couple with gas distribution plate 270 in order form plenum 263 that supplies process gas to each adjustable gas passage 260, 260', 260".

Each adjustable gas passage 260, 260', 260" comprises a positioning member 294 coupled to a drive system 292, 292', 292", respectively, that permits the adjustment of the position of each insertable member within its corresponding reentrant cavity. Additionally, each adjustable gas passage 260, 260', 260" comprises a feed-through 290, 290', 290" that is configured to sealably separate plenum 263 containing process gas from the outside environment where the drive systems 292, 292', 292" may be located. Alternatively, drive systems 292, 292', 292" may be located in plenum 263, and the feed-throughs 290, 290', 290" may not be needed.

Feed-throughs 290, 290', 290" may include vacuum feed-throughs understood to those skilled in the art of vacuum processing. For example, each feed-through 290, 290', 290" may comprise a plate 296 coupled to the positioning rod 294 and a bellows 298 coupled to the plate 296 and the housing member 262 as shown in FIG. 5. Alternatively, for example, each feed-through 290, 290', 290" may comprise a linear vacuum feed-through commercially available from Pfeiffer Vacuum.

Each adjustable gas passage 260 may be utilized to adjust each respective hollow cathode plasma in-situ, either manually or in a controlled manner. For example, the gas distribution system 200 may comprise a controller 295 coupled to the drive systems 292, 292', 292" and optionally coupled to power source 250. Controller 295 may be configured to receive input from an operator through a user interface and utilize the input to adjust each hollow cathode plasma. Furthermore, the controller 295 may be coupled to a diagnostic system (not shown) configured to measure plasma properties at one or more locations above the substrate and supply this spatial distribution of plasma properties to controller 295. For instance, the diagnostic system may include a translatable Langmuir probe.

As shown in FIG. 5, only a few adjustable passages are illustrated. However, gas distribution system 200 may include more or less. For example, gas distribution system 200 may include hundreds of adjustable gas passages. Although each drive system 292, 292', 292" and corresponding feed-through 290, 290', 290" is shown to adjust a single adjustable gas passage 260, 260', 260", they may be utilized to adjust groups of adjustable gas passages. For example, groups of adjustable gas passages may be organized according to regions above a substrate to be processed, e.g., a substantially central region, a substantially mid-radius region, a substantially peripheral region, etc.

As an example, the gas distribution system 200, depicted in FIG. 5, may be utilized with a capacitively coupled plasma (CCP) processing system. For example, the CCP processing system may be similar to the plasma processing system depicted in FIG. 1. The plasma processing system may comprise a plasma generation system, such as plasma generation system 140 in FIG. 1, that includes a RF powered upper electrode having a gas distribution system, such as gas distribution system 105 in FIG.1 or gas distribution system 200 in FIG. 5. Additionally, the plasma processing system may comprise a substrate holder, such as substrate holder 120 in FIG. 1, which may include a lower electrode coupled to ground or RF power. Furthermore, the plasma processing system comprises a vacuum chamber having internal surface that contact the plasma in the process space. These chamber surfaces may or may not be coated. Additionally, these surfaces may be coupled to ground.

Depending on the initial plasma density uniformity of the plasma processing system for a given process (i.e., without formation of any hollow cathode plasma), the positioning rods (i.e., positioning rod 294 in FIG. 5) may be retracted (i.e., no longer fully extending the insertable member into the reentrant cavity and, thus, igniting a hollow cathode plasma) to adjust for the uniformity of the plasma in the process space above the substrate. The plasma potential $V_P$ of the plasma in the process space is oscillating at a RF frequency and it is typically oscillating from just above zero V (volts) to a peak value of the time-varying voltage $V_{RF}(t)$, which could be hundreds of volts. Therefore, the time-averaged plasma potential $V_P$ could be a value of approximately 120V, for instance.

Conversely, since a hollow cathode plasma generally possesses a higher intensity and superior efficiency, its electron temperature $T_e$ is typically much lower than the electron temperature of the plasma in the process space and, its plasma potential $V_P$ is also very low, e.g., approximately 10V, for instance. As a result, the hollow cathode plasma electron may be accelerated by the space potential difference across the gas distribution system conduit (i.e., conduits 274 or 274' in FIG. 5) into the process space (i.e., for this example, approximately 110V). The inventors have observed this effect as electric (E)-field enhanced electron transport. In addition, these energetic electrons may be very efficient in direct impact ionization in the process space. As a result, the local plasma density of the plasma in the process space may be adjusted by adjusting the hollow cathode plasma, e.g., the local plasma density may be increased or decreased.

Figure 6:
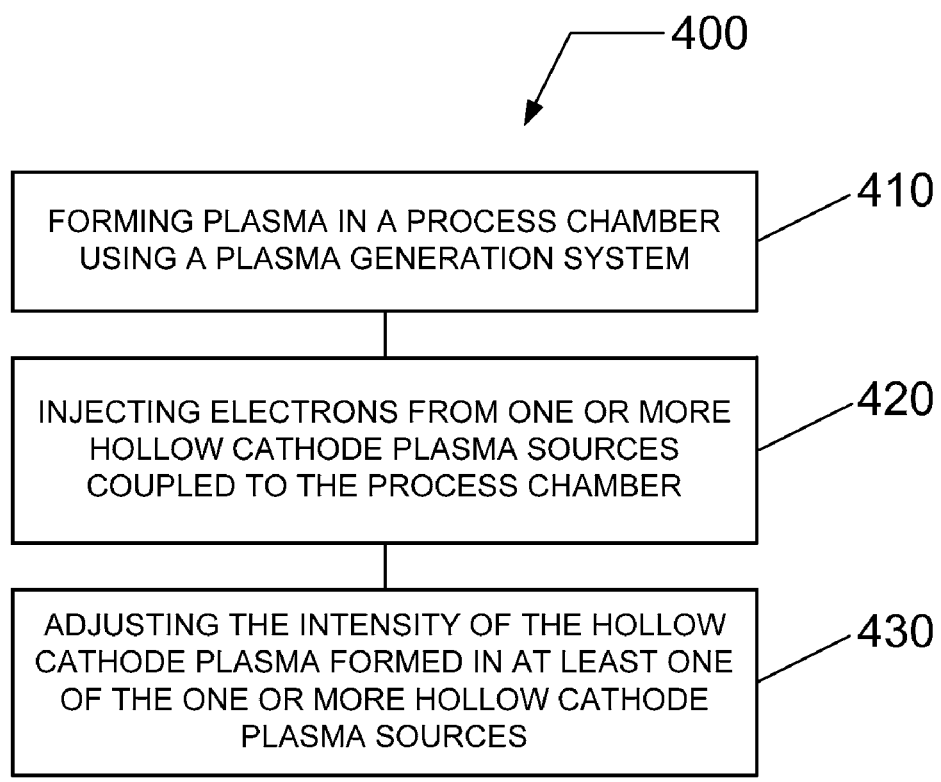
FIG. 6 illustrates a method of adjusting the spatial distribution of plasma according to yet another embodiment.

Referring now to FIG. 6, a flow chart 400 for a method of adjusting the spatial distribution of plasma in a process chamber is described according to an embodiment. Flow chart 400 begins in 410 with forming plasma in a process chamber using a plasma generation system. For example, plasma may be formed in the process space of the plasma processing system illustrated in FIG. 1.

In 420, electrons from one or more hollow cathode plasma sources coupled to the process chamber are injected into the process space. For example, hollow cathode electrons may be formed using any one of the embodiments described in FIGS. 3A, 3B, 3C, 4 and 5.

In 430, a property of the hollow cathode plasma formed in at least one of the one or more hollow cathode plasma sources is adjusted. The property of the hollow cathode plasma may include the plasma density, ion density, electron density, plasma temperature, electron energy distribution function, etc. For example, the flux of hollow cathode electrons may be adjusted using any one of the embodiments described in FIGS. 3A, 3B, 3C, 4 and 5. Additionally, for example, each hollow cathode plasma may be adjusted in-situ, either manually or in a controlled manner as depicted in FIG. 5.

Furthermore, one or more of the hollow cathode plasma sources may be turned on (i.e., ignite a hollow cathode plasma) or turned off (i.e., extinguish a hollow cathode plasma).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of adjusting the spatial distribution of plasma in a process chamber, comprising:
   forming plasma in a process chamber using a plasma generation system;
   injecting electrons from one or more hollow cathode plasma sources coupled to said process chamber, wherein at least one of the hollow cathode plasma sources is configured to create a hollow cathode plasma in a hollow cathode region, the hollow cathode region being at least in part enclosed by the hollow cathode plasma source, the hollow cathode plasma source having one or more plasma-facing surfaces in contact with said hollow cathode plasma, wherein at least one of said one or more plasma-facing surfaces is movable in order to vary the size of said hollow cathode region to adjust the properties of said hollow cathode plasma; and
   adjusting a property of the hollow cathode plasma formed in at least one of said one or more hollow cathode plasma sources.

2. The method of claim 1, wherein said adjusting is performed in-situ.

3. The method of claim 1, further comprising:
   turning on the hollow cathode plasma in a plurality of said one or more hollow cathode plasma sources.

4. The method of claim 1, further comprising:
   turning off the hollow cathode plasma in a plurality of said one or more hollow cathode plasma sources.

* * * * *